United States Patent
Garcia et al.

(10) Patent No.: US 7,781,061 B2
(45) Date of Patent: Aug. 24, 2010

(54) DEVICES WITH GRAPHENE LAYERS

(75) Inventors: Jorge Manuel Garcia, Summit, NJ (US); Loren N. Pfeiffer, Harding Township, Morris County, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 148 days.

(21) Appl. No.: 12/006,155

(22) Filed: Dec. 31, 2007

(65) Prior Publication Data
US 2009/0169919 A1 Jul. 2, 2009

(51) Int. Cl.
*B32B 9/00* (2006.01)
*H01L 31/0312* (2006.01)

(52) U.S. Cl. .................. 428/402; 428/408; 428/688; 257/77

(58) Field of Classification Search .............. 428/402, 428/408, 688; 257/76, 77, 288, 295, E21.294
See application file for complete search history.

(56) References Cited

U.S. PATENT DOCUMENTS

| 4,239,955 | A | 12/1980 | Cho | 219/271 |
| 7,015,142 | B2 | 3/2006 | DeHeer et al. | 438/689 |
| 2003/0186059 | A1 | 10/2003 | Hirata | 428/408 |
| 2005/0212014 | A1 | 9/2005 | Horibe et al. | 257/213 |
| 2006/0236936 | A1 | 10/2006 | Pfeiffer et al. | 118/726 |
| 2007/0187694 | A1 | 8/2007 | Pfeiffer | 257/76 |

FOREIGN PATENT DOCUMENTS

JP  2007 019086 A  1/2007
WO  WO 2006/127017 A2  11/2006

OTHER PUBLICATIONS

Kurihara et al., Epitaxial growth of graphite layer on {111} surface of vapor-deposited diamond, May 1, 1991, Journal of Applied Physics, 69, p. 6360-6363.*
Lambrecht et al., Diamond nucleation by hydrogenation of the edges of graphitic precursors, Aug. 12, 1993, Nature, 364, p. 607-610.*
M Wilson, "Electrons in Atomically . . . ," *Phys. Today*, pp. 21-23 (Jan. 2006).
C. Berger et al., "Ultrathin Epitaxial Graphite . . . ," *J. Phys. Chem B*, vol. 108, pp. 19912-19916 (Dec. 2004).
M. Hubacek, "Synthesis of Boron Nitride . . . ," available on internet website URL http://hubacek.jp/bn/bn.htm on or before Feb. 9, 2006, 10 pages.
J. W. Matthews et al., "Almost perfect epitaxial multilayers," *J. Vac. Sci. Technol.*, vol. 14, No. 4, pp. 989-991 (Jul./Aug. 1977).
K. S. Novoselov et al., "Two-dimensional gas . . . ," *Nature*, vol. 438, pp. 197-200 (Nov. 2005).

(Continued)

*Primary Examiner*—Timothy M Speer
(74) *Attorney, Agent, or Firm*—John F. McCabe

(57) ABSTRACT

A method includes an act of providing a crystalline substrate with a diamond-type lattice and an exposed substantially (111)-surface. The method also includes an act of forming a graphene layer or a graphene-like layer on the exposed substantially (111)-surface.

14 Claims, 4 Drawing Sheets

OTHER PUBLICATIONS

Y. Zhang et al., "Experimental observation . . . ," *Nature*, vol. 438, pp. 201-204 (Nov. 2005).

J. D. H. Donnay et al., "Crystal Data, Determinative Tables," 3$^{rd}$ Ed., *US Dept. Comm., NBS*, pp. H256, H259 (1973).

J. Y. Tsao, "Materials Fundamentals of Molecular Beam Epitaxy," *Academic Press, Inc.*, p. 167 (1993).

K. S. Novoselov et al., "Electric Field Effect . . . ," *Science*, vol. 306, pp. 666-669 (Oct. 2004).

L. N. Pfeiffer et al., "Ballistic hole transport . . . ," *Appl. Phys. Lett*, vol. 87, pp. 073111-(1-3) (Sep. 2005).

R. J. Malik et al., "Carbon doping in molecular beam epitaxy . . . ," *Appl. Phys. Lett.*, vol. 53, No. 26, pp. 2661-2663 (Dec. 1988).

R. J. Malik et al., "Properties and applications of carbon-doped GaAs . . . ," *J. Crystal. Growth*, vol. 127, pp. 686-689 (1993).

M. Micovic et al., "Quantum well lasers with carbon doped cladding . . . ," *Appl. Phys. Lett.*, vol. 64, Nov. 4, pp. 411-413 (Jan. 1994).

A. Mak et al., Carbon filament source . . . , *J. Vac Sci. Technol B.*, vol. 12, No. 3, pp. 1407-1409 (May/Jun. 1994).

EPI MBE Products Group, "High Performance Components To Make the Most of Your MBE System(2000) Product Guide," p. 67.

MBE Komponenten, "Products 2003," pp. 38-39, (2003) Available Online at www.mbe-components.com.

Y. Zhang, et al, "Experimental observation of the quantum Hall effect and Berry's phase in graphene," *Nature (Letters)*, vol. 438, Nov. 10, 2005, pp. 201-204.

K.S. Novoselov, et al, "Electric Field Effect in Atomically Thin Carbon Films," *Science*, vol. 306, Oct. 22, 2004, pp. 666-669.

K.S. Novoselov, et al, "Two-dimensional gas of massless Dirac fermions in graphene," *Nature (Letters)*, vol. 438, Nov. 10, 2005, pp. 197-200.

C. Berger, et al, "Ultrathin Epitaxial Graphite: 2D Electron Gas Properties and a Route toward Graphene-based Nanoelectronics," *J. Phys. Chem. B*, vol. 108, No. 52, 2004, pp. 19912-19916.

A.K. Geim, et al, "The rise of graphene," *Nature Materials*, vol. 6, Mar. 2007, pp. 183-191.

Mark Wilson, "Electrons in Atomically Thin Carbon Sheets Behave like Massless Particles," *Physics Today*, Jan. 2006, pp. 21-23.

PCT International Search Report dated Mar. 13 2009 (PCT/US2008/013796) 3 pages.

Gianluca Giovannetti et al., "Substrate-induced bandgap in graphene on hexagonal boron nitride." Jul. 30, 2007. Document ID: ArXiv : 0704.1994v2 [cond-mat.mtrl-sci], available online at: www.arXiv.org. 5 pages.

Boron nitride, From Wikipedia, the free encyclopedia, available online at: http://en.wikipedia.org/w/index.php?title=Boron_nitride&oldid=180987411, Dec. 30, 2007, 5 pages.

Graphene, From Wikipedia, the free encyclopedia, a available online at: http://en.wikipedia.org/w/index.php?title=Graphene&oldid=178990339#Properties, Dec. 19, 2007, 4 pages.

\* cited by examiner

DEVICES WITH GRAPHENE LAYERS

BACKGROUND

1. Field of the Invention

This invention relates to making semiconductor layers and devices that incorporate such layers.

2. Description of the Related Art

This section introduces aspects that may help facilitate a better understanding of the invention. Accordingly, the statements of this section are to be read in this light and are not to be understood as admissions about what is in the prior art or what is not in the prior art.

Recently, there has been much interest in a material known as graphene. Graphene typically refers to a single planar sheet of covalently bonded carbon atoms. Graphene is believed to be formed of a plane of carbon atoms that are $sp^2$-bonded carbon to form a regular hexagonal lattice with an aromatic structure. The interest in graphene is due, in part, to a hope to make transistors with graphene.

Graphene appears to have been produced by two methods. The first method involves using an adhesive material to peal a graphene layer off a thick crystal whose lattice structure is that of graphene. The second method involves evaporating silicon off a surface of silicon carbide at high temperatures.

SUMMARY

Various embodiments provide methods for producing an apparatus with a graphene-like layer. Herein, a graphene-like layer is a crystal that is 1-5 carbon atoms thick, preferably is 1-3 carbon atoms thick, and more preferably is a single layer of carbon atoms thick. In each lattice plane of a graphene-like layer, the carbon atoms are covalently bonded into a regular 2D hexagonal lattice.

One aspect features a method. The method includes providing a crystalline substrate with a diamond-type lattice and an exposed substantially (111)-surface. The method also includes forming a graphene layer or a graphene-like layer on the exposed substantially (111)-surface.

In some embodiments of the method, the substrate is, e.g., diamond or cubic boron nitride.

In some embodiments of the method, the act of forming includes depositing a one or more layers of carbon atoms on the exposed substantially (111)-surface and annealing the deposited one or more layers of carbon atoms to produce the graphene-like layer.

Some embodiments of the method include forming a layer of boron nitride on a portion of the graphene-like layer and may further include forming a gate electrode on the layer of boron nitride.

Another aspect features an apparatus that includes a crystalline substrate with a diamond-type lattice and a substantially (111)-surface and a graphene-like layer on the substantially (111)-surface.

In some embodiments of the apparatus, the substrate may be diamond or cubic boron nitride.

In some embodiments, the apparatus further includes a layer of boron nitride on a portion of the graphene-like layer and may also include a gate electrode on the layer of boron nitride.

BRIEF DESCRIPTION OF THE DRAWINGS

In the Figures and text, similar reference numbers refer to features with substantially similar functions and/or substantially similar structures.

In the Figures, relative dimensions of some features may be exaggerated to more clearly illustrate the structures therein.

Herein, various embodiments are described more fully by the Figures and the Detailed Description of Illustrative Embodiments. Nevertheless, the inventions may be embodied in various forms and are not limited to the specific embodiments that are described in the Figures and the Detailed Description of Illustrative Embodiments.

DETAILED DESCRIPTION OF THE EMBODIMENTS

Herein, a diamond-type lattice is a cubic lattice with a face-centered complex unit cell. The complex unit cell has two entities or atoms that are shifted along the unit cell's diagonal by ½ the length thereof. Diamond and cubic boron nitride have, e.g., the diamond lattice.

Figure 1:
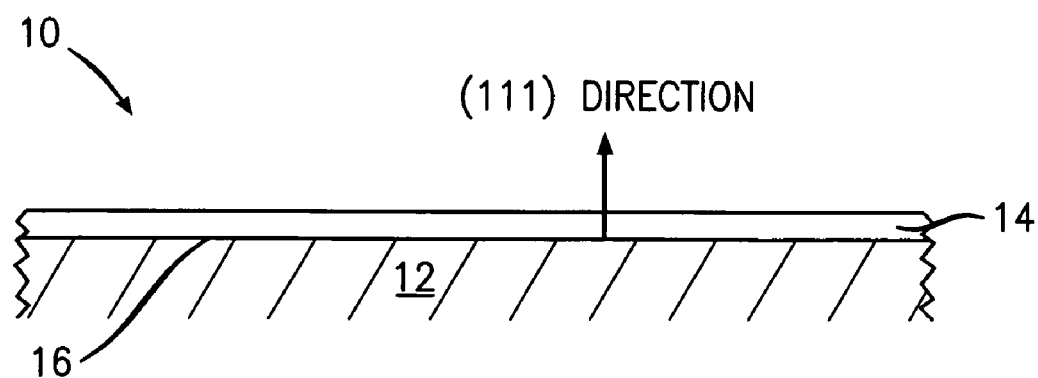
FIG. 1 is a cross-sectional view of an apparatus with a graphene-like layer.

FIG. 1 shows an apparatus 10 that includes a crystalline substrate 12 and a graphene-like layer 14 that is located directly on a planar surface 16 of the crystalline substrate 12. The crystalline substrate 12 has diamond-type crystal lattice. The planar surface 16 is substantially a (111)-surface of the crystalline substrate 12. Herein, substantially (111)-surfaces are substantially aligned with the (111) lattice direction of the crystalline substrate 12. For example, the alignment error between a substantially (111)-surface and a (111)-lattice plane is less than 1 degree, preferably is less than 0.1 degrees, and more preferably is 0 degrees. For example, an alignment error of zero degrees may be produced by cleaving a diamond-type crystal along a (111)-lattice plane. Thus, the surface 16 may be an exact (111)-lattice plane or may be made of a staircase formed of a series of wide, atomically flat terraces that are perpendicular to (111)-lattice direction.

Figure 2:
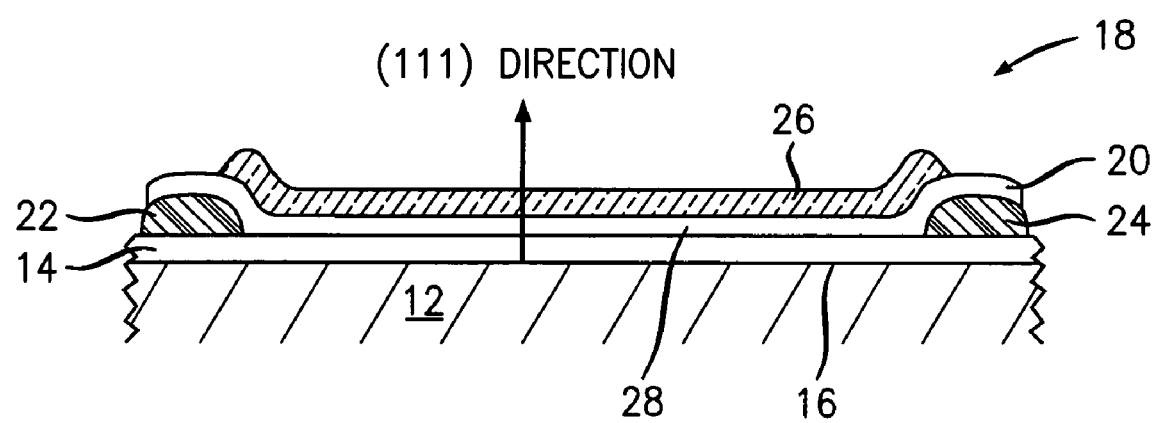
FIG. 2 is a cross-sectional view of a transistor that includes the apparatus of FIG. 1.

FIG. 2 shows a transistor 18 that includes a substrate 12 and a graphene-like layer 14 as described with respect to the apparatus 10 of FIG. 1. In addition, the transistor 18 also includes a dielectric layer 20, a source electrode 22, a drain electrode 24, and a gate electrode 26.

The source and drain electrodes 22, 24 are in direct contact with the graphene-like layer 14 and define the ends of an electrically controllable channel portion 28 of the graphene-like layer 14. The gate electrode 26 controls the conductivity of the electrically controllable channel portion 28 of the graphene-like layer 14 and thus, controls conduction between the source and drain electrodes 22, 24. The electrodes 22, 24, 26 may be metallic layers or metallic multi-layers, which are formed by conventional processes, e.g., conventional gold-titanium multi-layers, which would be known to persons of skill in the microelectronics fabrication art.

The dielectric layer 20 covers the electrically controllable channel portion 28 of the graphene-like layer 14. The dielectric layer 20 functions as an electrically insulating gate dielectric for the gate electrode 26. Exemplary dielectric layers 20 may be fabricated of a variety of inorganic and organic dielectrics that would be known to persons of skill in the art, e.g., silicon dioxide, silicon nitride, etc.

Various embodiments provide for growing a graphene layer or a graphene-like layer on a substantially (111)-surface of a crystalline substrate that has a diamond lattice. These embodiments provide additive methods of producing the graphene or graphene-like layers on the crystalline substrates.

Figure 3:
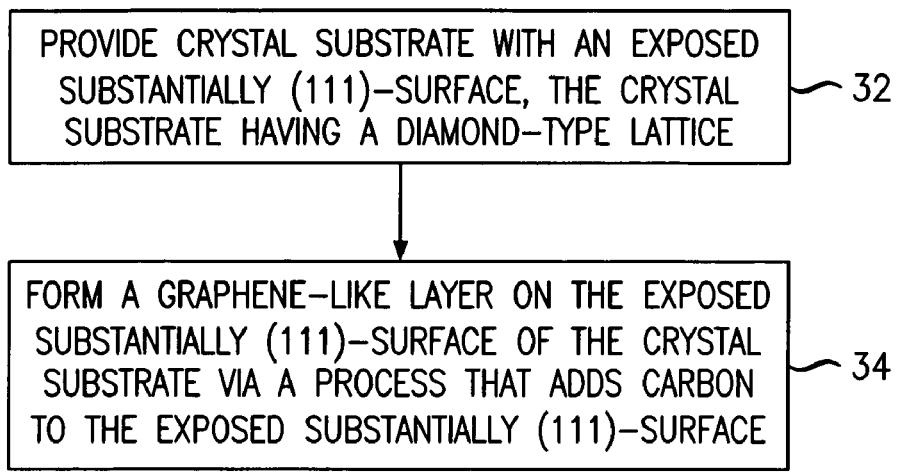
FIG. 3 is a flow chart illustrating a method of manufacturing an apparatus with a graphene-like layer, e.g., the apparatus of FIG. 1.

FIG. 3 illustrates a method 30 of fabricating an apparatus having a graphene or graphene-like layer, e.g., the apparatus 10 shown in FIGS. 1-2.

The method 30 includes providing crystalline substrate with a diamond-type lattice and an exposed substantially (111)-surface, e.g., the crystalline substrate 12 with the surface 16 as shown in FIGS. 1-2 (step 32). The crystal substrate may have lattice constants along the (111)-surface that closely match to those of graphite along easy shearing surfaces thereof. For example, parallel to the (111)-surface, lattice constants of the crystalline substrate may differ from those of graphite by less than about 3 percent or even by less than about 2 percent.

The method 30 includes forming a graphene-like layer on the exposed substantially (111)-surface of the crystalline substrate, e.g., the layer 14 of FIGS. 1-2, by a process that adds carbon atoms to the exposed substantially (111)-surface (step 34). The forming step produces a layer that is 1-5 carbon atoms thick, is preferable 1-3 carbon atoms thick, and is more preferably a monolayer of carbon atoms. The step 34 involves adding carbon atoms to the exposed substantially (111)-surface of the crystalline substrate.

Figure 4:
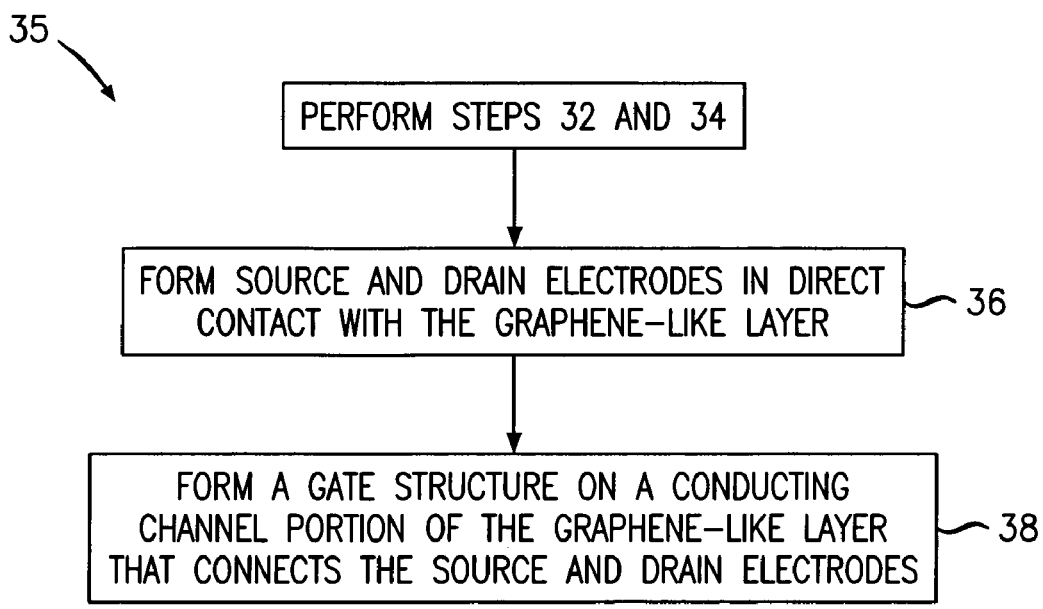
FIG. 4 is a flow chart illustrating a method of manufacturing a transistor with a graphene-like layer, e.g., the transistor of FIG. 2.

FIG. 4 illustrates a method 35 of fabricating an apparatus having a graphene-like layer, e.g., the layer 14 as shown in FIGS. 1-2.

The method 35 includes performing the steps 32 and 34 as described in the method 30 of FIG. 3.

In addition, the method 35 includes forming source and drain electrodes, e.g., the electrodes 22, 24 of FIG. 2, in direct physical contact with the graphene-like layer (step 36). Edges of the source and drain electrodes form the ends of a voltage-controllable channel in the graphene-like layer. In particular, the channel can carry a current between the source and drain electrodes in response to an application of a selected set of gate voltages laterally across the channel. The source and drain electrodes may be patterned metallic layers, e.g., electrodes formed by a conventional shadow mask-controlled evaporation-deposition of metal. Exemplary source and drain electrodes may be conventional gold-titanium multi-layers that would be known to persons of skill in the microelectronics fabrication arts.

In addition, the method 35 includes forming a gate structure over a voltage-controllable conducting channel portion of the graphene-like layer (step 38). The gate structure includes a gate dielectric layer, e.g., the layer 20 of FIG. 2, and a gate electrode, e.g., the gate electrode 26 of FIG. 2. The gate dielectric layer may be formed of any inorganic or organic dielectric conventionally used by persons of skill in the art for microelectronics fabrication. The gate electrode may be a metal layer or multi-layer, e.g., a gold-titanium multi-layer that is evaporation-deposited under the control of a mask. The gate structure can increase or decrease the density of mobile charge carriers in the conducting channel portion of the graphene-like layer via a voltage that is applied between the gate electrode and the source or drain electrode. The conducting channel portion of the graphene-line layer is a controllable conduction channel that electrically connects the source and drain electrodes.

With respect to the above-described methods 30, 35, the inventors realized that (111)-surfaces of ordinary diamond and cubic boron nitride would probably be well suited for growing graphene-like layers. In particular, the (111)-surfaces of these two crystals are slightly deformed two-dimensional hexagonal lattices. Also, the lattice constants/lengths of ordinary diamond and cubic boron nitride along (111) lattice planes are close to the lattice constants/lengths in graphite along its easy shearing surface. Finally, the lattice constants/lengths of graphene and graphite along its easy shearing surface are expected to be similar or identical. For the above reasons, the inventors decided that exposed (111)-surfaces of ordinary diamond and/or cubic boron nitride would be suitable surfaces for epitaxially growing the hexagonal lattice of a graphene-like layer.

Figure 5:
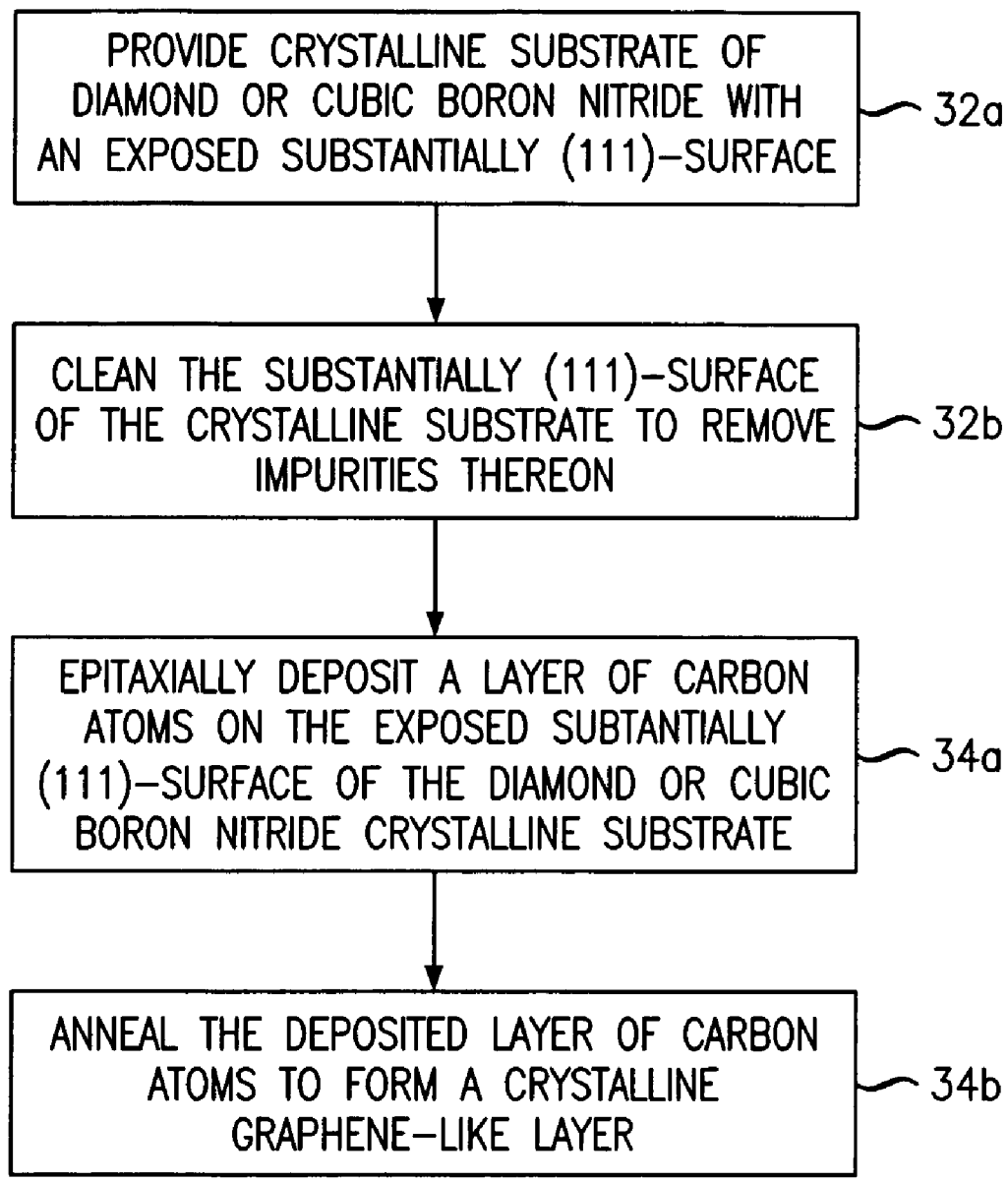
FIG. 5 is a flow chart illustrating a specific embodiment of the method of FIG. 3.

FIG. 5 illustrates a specific embodiment 40 of the method 30 of FIG. 3, which is based on a crystalline diamond or cubic boron nitride substrate.

The method 40 includes providing a crystalline substrate of ordinary diamond or cubic boron nitride, wherein the crystalline substrate has an exposed substantially (111)-surface (step 32a).

A diamond substrate may be cleaved to expose a suitable substantially (111)-surface. The cutting of diamonds for the production of jewelry can produce diamond pieces with substantially (111)-surfaces or diamond pieces that can easily be cleaved to produce (111)-surfaces. These diamond pieces are commercially sold as diamond maccles.

A diamond substrate may also be grown with an exposed substantially (111)-lattice plane. Such diamonds substrates are grown, e.g., by a chemical vapor deposition process and sold by Element Six Ltd. of King's Ride Park, Ascot, Berkshire, SL5 8BP England (www.e6.com) under the product name of Monodie 111.

A cubic boron nitride substrate may be grown, e.g., by conventional epitaxial growth processes on a substrate having an exposed substantially (111)-lattice plane. One substrate that may be suitable for growing cubic boron nitride substrate is the (111)-surface of a diamond maccle.

The method 40 includes cleaning the crystalline substrate to remove impurities on the exposed substantially (111)-surface (step 32b). For example, the cleaning may involve performing an $O_2$ plasma etch of the substantially (111)-surface. A suitable exemplary plasma etcher is the Model 790 plasma etcher, which is made by Plasma-Therm, Inc. of 9509 International Court, St. Petersburg, Fla. 33716. With such a plasma etcher, suitable etch conditions for cleaning the substrate are: an RF voltage of 100 volts, 30 sccm of oxygen, an etching time of about 1.5 minutes to 5.0 minutes, a substrate temperature of about 30° C., and a pressure of between $10^{-2}$ and $10^{-4}$ Torr, e.g., a pressure of about $10^{-3}$ Torr. The cleaning step may also include annealing the substrate at about 1100° C. for about 1 hour after performing the $O_2$ plasma etch.

The method 40 includes epitaxially depositing one or more layers of carbon atoms on the exposed substantially (111)-surface of the diamond or boron nitride crystalline substrate (step 34a). The epitaxial deposition may produce a layer of carbon atoms that is amorphous. The layer has a thickness of 1-5 approximate atomic layers, and preferably has a thickness of 1-3 approximate atomic layers, and most preferably has the thickness of a monolayer of carbon atoms. The thickness of the final layer may controlled by timing the deposition to produce the desired atomic thickness. The timing of the deposition may be based on a measurement of an approximate layer deposition rate for depositions of thicker layers of carbon atoms under the similar conditions. Based on the measurements for such thicker layers, the deposition of step 34 can be timed to achieve a covering of the exposed substantially (111)-surface of the crystalline substrate by a thin layer of carbon atoms to the desired thickness.

Exemplary conditions for the epitaxial growth of the layer of carbon atoms include electrically heating vitreous carbon filament to produce the carbon atoms for the deposition and maintaining the substrate at a temperature of about 280° C. to 400° C. during the epitaxial deposition. During such a deposition, a typical temperature for a vitreous carbon filament source is about 1900° C. to 1950° C. For such operating conditions, a deposition rate of about one layer or more of carbon atoms per 30 minutes can be achieved. Suitable exemplary apparatus and methods for performing carbon depositions with electrically heated vitreous carbon filament sources may be described, e.g., in U.S. patent application Ser. No. 11/114,828, filed on Apr. 26, 2005 by Loren N. Pfeiffer and Kenneth W. West. This patent application is incorporated herein by reference in its entirety.

The method 40 includes annealing the deposited layer of carbon atoms to form a graphene layer or a graphene-like layer (step 34b). The anneal step may include heating the substrate having the deposited layer of carbon atoms to about 1200° C. to 1600° C. for between 15 and 900 minutes. Such an anneal enables the carbon atoms, which initially form, e.g., an amorphous layer, to rearrange into the two-dimensional hexagonal crystal lattice structure of graphene and graphene-like layers.

Figure 6:
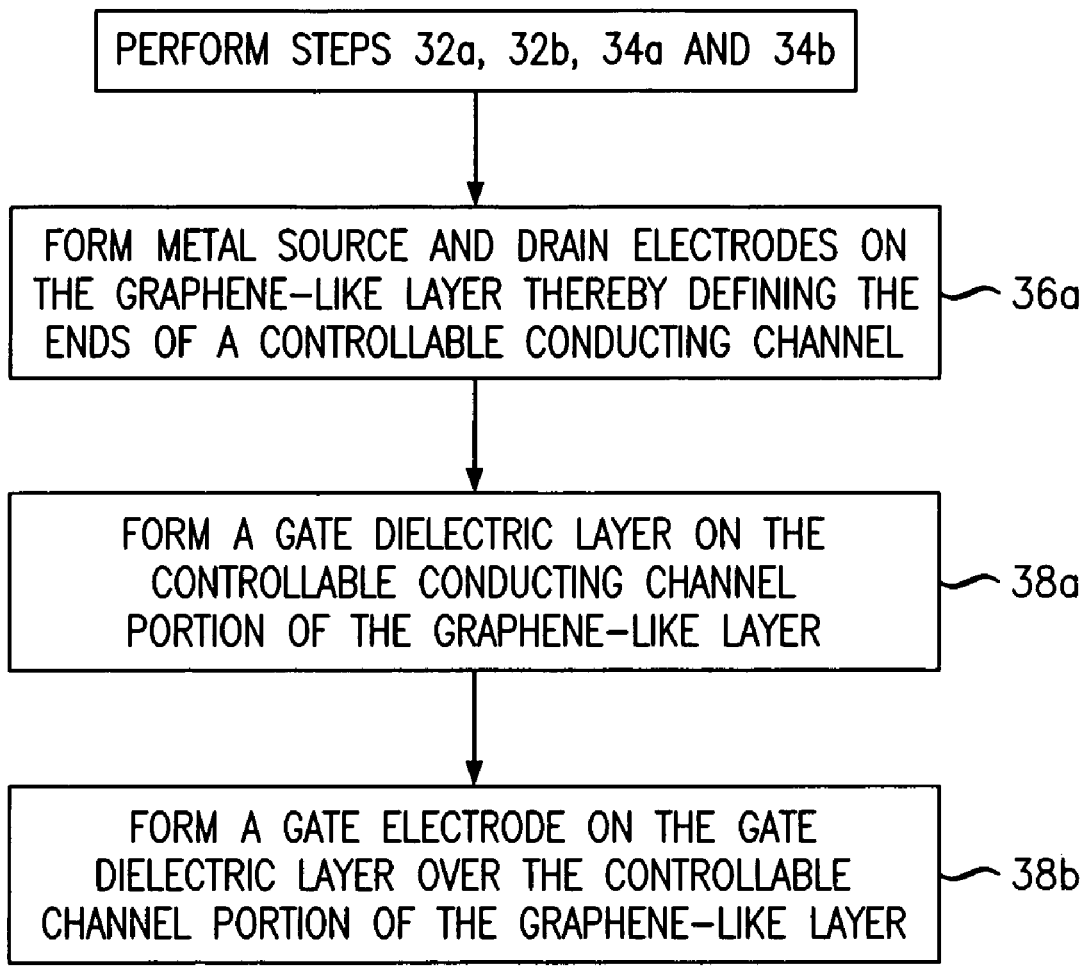
FIG. 6 is a flow chart illustrating a specific embodiment of the method of FIG. 4.

FIG. 6 illustrates a specific embodiment 45 for making a transistor according to the method 40 of FIG. 5.

The method 45 includes performing the steps 32a, 32b, 34a, and 34b of the above method 40, e.g., as illustrated in FIG. 5.

The method 45 includes forming metal source and drain electrodes directly on the graphene-like layer produced at the steps 34a-34b, wherein the electrodes are formed to be in direct physical contact with the graphene-like layer (step 36a). The formation of the source and drain electrodes determines the positions of the ends of a voltage-controllable conduction channel portion of the graphene-like layer. The metal source and drain electrodes may be formed by a conventional mask-controlled evaporation-deposition of a metal layer or a metal multi-layer, e.g., a deposition of a conventional gold-titanium multi-layer under the control of a shadow mask.

The method 45 includes forming a gate dielectric layer directly on, at least, the voltage-controllable conducting channel portion of the graphene-like layer (step 38a). The formed gate dielectric layer may also cover part of or the entire source and drain electrodes. The formation of the gate dielectric layer may involve a deposition of any organic dielectric or inorganic dielectric that is conventionally used in the fabrication of microelectronics integrated electronic devices, e.g., silicon dioxide or silicon nitride. The formation of the dielectric layer may alternatively involve an epitaxial growth of a crystalline layer of boron nitride on the graphene-like layer. For example, the grown layer may be hexagonal crystalline boron nitride. This gate dielectric layer of boron nitride can be epitaxially grown under conditions similar to those used to epitaxially grow a cubic boron nitride layer for use as the crystalline substrate on which the graphene-like layer can be epitaxially grown.

Suitable apparatus and conditions for epitaxially growing such boron nitride layers may be described, e.g., in U.S. patent application Ser. No. 11/355,360, filed by Loren Pfeiffer on Feb. 16, 2006 ('360 application). This '360 application is incorporated herein by reference in its entirety.

At the substep 38a, it may be very advantageous to form the gate dielectric of crystalline boron nitride if the crystalline substrate under the graphene-like layer is also boron nitride. Indeed, in such embodiments, the same chamber may be used to form the substrate, the graphene-like layer, and the gate dielectric. Thus, it may be possible to finish the fabrication of the layers on both sides of the graphene-like layer without removing the device-being-fabricated from the fabrication chamber. For that reason, the presence of randomly distributed impurities along interfaces between the graphene-like layer and the crystalline substrate and gate dielectric may be significantly reduced. At these interfaces, the presence of such charged impurities might otherwise worsen the conduction properties of the graphene-like layer. For that reason, a reduction of the density of such impurities may enable the production of significantly better devices with graphene-like channels.

In some embodiments, the method 45 may involve performing the substep 38a prior to performing the substep 36a. That is, the gate dielectric may be formed at the substep 38a, prior to the formation of the metal source and drain electrodes at the substep 36a. For example, the formation of the metal source and drain electrodes may involve dry etching trenches in the gate dielectric to expose parts of the graphene-like layer and then, depositing metal into the trenches to complete the metal source and drain electrodes. This ordering of the substeps 36a and 38a may provide a better protection to the graphene-like channel during the formation of the source and drain electrodes, i.e., due to the gate dielectric covering there over.

Finally, the method 45 includes forming a metal gate electrode on the gate dielectric layer such that the metal gate electrode is located vertically over the voltage-controllable conducting channel portion of the graphene-like layer (step 38b). The formation of the gate electrode can involve performing metal deposition(s) on the dielectric layer under conditions similar to those described above for the formation of the metal layers for the source and drain electrodes. The formation of the gate electrode completes the fabrication of a transistor with a graphene-like layer on a diamond or cubic boron nitride substrate.

Other embodiments of the invention will be apparent to those of skill in the art in light of the specification, drawings, and claims of this application.

What we claim is:

1. An apparatus, comprising:
  a crystalline substrate with a diamond-type lattice and a substantially (111)-surface, the crystalline substrate being a cubic boron nitride substrate;
  a graphene-like layer on the substantially (111)-surface; and
  a region comprising boron nitride on a portion of the graphene-like layer, the portion of the graphene-like layer being located between the region comprising boron nitride and the substrate.

2. The apparatus of claim 1, wherein the (111)-surface has lateral lattice constants that match those of lattice constants of the graphene-like layer to, at least, about 3 percent.

3. The apparatus of claim 1, wherein the graphene-like layer is graphene.

4. The apparatus of claim 1, further comprising a gate electrode over the region comprising boron nitride.

5. The apparatus of claim 4 wherein a portion of the graphene-like layer is an electrically controllable conduction channel of a transistor, the channel being controllable by the gate electrode.

6. The apparatus of claim 4, wherein the region is a crystalline layer of boron nitride.

7. The apparatus of claim 1, wherein the graphene-like layer is 1 to 3 carbon atoms thick.

8. The apparatus of claim 7, wherein the region is crystalline layer of boron nitride.

9. The apparatus of claim 1, wherein the graphene-like layer is graphene.

10. The apparatus of claim 1, further comprising:
source and drain electrodes of a transistor, the electrodes being in contact with a channel portion of the graphene-like layer; and
a gate electrode of the transistor, the region comprising boron nitride being located between the gate electrode and the channel portion of the graphene-like layer, the gate electrode being configured to control the channel portion of the graphene-like layer.

11. The apparatus of claim 10, wherein the graphene-like layer is 1 to 3 carbon atoms thick.

12. The apparatus of claim 10, wherein the graphene-like layer is graphene.

13. The apparatus of claim 10, wherein the region is crystalline layer of boron nitride.

14. The apparatus of claim 1, wherein the region is a layer of boron nitride.

* * * * *